(12) United States Patent
Ichiyama et al.

(10) Patent No.: US 7,501,905 B2
(45) Date of Patent: Mar. 10, 2009

(54) OSCILLATOR CIRCUIT, PLL CIRCUIT, SEMICONDUCTOR CHIP, AND TEST APPARATUS

(75) Inventors: Kiyotaka Ichiyama, Tokyo (JP); Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 67 days.

(21) Appl. No.: 11/609,950

(22) Filed: Dec. 13, 2006

(65) Prior Publication Data

US 2008/0143453 A1    Jun. 19, 2008

(51) Int. Cl.
*H03B 1/00* (2006.01)
(52) U.S. Cl. .......................................... 331/74; 331/17
(58) Field of Classification Search ................ 331/74, 331/17
See application file for complete search history.

(56) References Cited

U.S. PATENT DOCUMENTS 6,614,318 B1 *  9/2003  Boecker ...................... 331/17

2007/0008044 A1 *  1/2007  Shimamoto .................. 331/57
2007/0239388 A1 * 10/2007  Ichiyama et al. ............ 702/117
2007/0247181 A1 * 10/2007  Ishida et al. ................ 324/765

* cited by examiner

*Primary Examiner*—Joseph Chang
(74) *Attorney, Agent, or Firm*—Sterne, Kessler, Goldstein & Fox P.L.L.C.

(57) ABSTRACT

An oscillator circuit that generates an oscillation signal is provided. The oscillator circuit includes: a voltage controlled oscillator that outputs the oscillation signal with a frequency corresponding to a provided control voltage; and a jitter demodulator that extracts a phase fluctuation component of the oscillation signal outputted by the voltage controlled oscillator and modulates the control voltage according to the phase fluctuation component. The oscillator circuit may further include a low pass filter that removes a frequency component larger than a predetermined cutoff frequency of the control frequency inputted to the voltage controlled oscillator and provides the same to the voltage controlled oscillator.

23 Claims, 13 Drawing Sheets

_US 7,501,905 B2_

OSCILLATOR CIRCUIT, PLL CIRCUIT, SEMICONDUCTOR CHIP, AND TEST APPARATUS

BACKGROUND

1. Field of the Invention

The present invention relates to an oscillator circuit, a PLL circuit, a semiconductor chip, and a test apparatus. Particularly, the present invention relates to an oscillator circuit that generates an oscillation signal with low phase noise and a PLL circuit a semiconductor chip and a test apparatus that employ the oscillator circuit.

2. Related Art

A voltage controlled oscillator (VCO) has been known as a circuit that generates an oscillation signal. The voltage controlled oscillator is an oscillator in which the frequency of an oscillation signal is controlled corresponding to an input control voltage. For example, the voltage controlled oscillator generates an oscillation signal with a frequency corresponding to an input voltage by circularly connecting a plurality of inverters in which the delay time is changed according to the input control voltage.

However, since the voltage controlled oscillator has the loop described above, a phase noise component generated in a previous cycle is accumulated in a subsequent cycle. Therefore, it has had a problem that a voltage controlled oscillator generates an oscillation signal with a large phase noise component.

Additionally, it is difficult for a semiconductor chip and a test apparatus employing the voltage controlled oscillator to accurately operate because the phase noise component of the oscillation signal generated by the voltage controlled oscillator is large.

Generally, it has been considered that the phase noise generated in the voltage controlled oscillator is reduced by employing the voltage controlled oscillator in a PLL circuit. However, an oscillation signal is synchronized with a reference signal corresponding to an edge of the provided reference signal in the PLL circuit. Therefore, the accumulated phase noise component is cut every time the edge of the reference signal is provided. However, the phase noise component can not be removed while the PLL circuit self-oscillates between the edges of the reference signal. Moreover, the jitter component of the reference signal for the PLL circuit causes the oscillation signal to generate jitter.

Thus, an advantage of the present invention is to provide an oscillator circuit, a PLL circuit, a semiconductor chip, and a test apparatus which are capable of solving the problem accompanying the conventional art. The above and other advantages can be achieved by combining the features recited in independent claims. Then, dependent claims define further effective specific example of the present invention.

SUMMARY

In order to solve the above described problems, a first aspect of the present invention provides an oscillator circuit that generates an oscillation signal. The oscillator circuit includes: a voltage controlled oscillator that outputs the oscillation signal having a frequency corresponding to a provided control voltage; and a jitter demodulator that extracts a phase fluctuation component of the oscillation signal outputted by the voltage controlled oscillator and modulates the control voltage according to the phase fluctuation component.

A second aspect of the present invention provides a PLL circuit that generates an oscillation signal. The PLL circuit includes: an oscillator circuit that generates the oscillation signal; a phase detector that detects the phase difference between the oscillation signal outputted by the oscillator circuit and a provided reference signal; and a control section that provides a control voltage corresponding to the phase difference detected by the phase detector to the oscillator circuit. The oscillator circuit includes: a voltage controlled oscillator that outputs the oscillation signal having a frequency corresponding to the control voltage provided from the control section; and a jitter demodulator that extracts a phase fluctuation component of the oscillation signal outputted by the voltage controlled oscillator and adjusts the control voltage according to the phase fluctuation component.

A third aspect of the present invention provides a semiconductor chip that generates an oscillation signal including an oscillator circuit that generates the oscillation signal and a circuit board on which the oscillator circuit is provided. The oscillator circuit includes: a voltage controlled oscillator that outputs the oscillation signal having a frequency corresponding to a provided control voltage; and a jitter demodulator that extracts a phase fluctuation component of the oscillation signal outputted by the voltage controlled oscillator and adjusts the control voltage according to the phase fluctuation component.

A fourth aspect of the present invention provides a test apparatus that tests a device under test. The test apparatus includes: an oscillator circuit that generates an oscillation signal; a sampling section that samples a signal outputted by the device under test corresponding to the oscillation signal; and a judgment section that judges pass/fail of the device under test based on the result of the sampling by the sampling section. The oscillator circuit including: a voltage controlled oscillator that outputs the oscillation signal having a frequency corresponding to a provided control voltage; and a jitter demodulator that extracts a phase fluctuation component of the oscillation signal outputted by the voltage controlled oscillator and adjusts the control voltage according to the phase fluctuation component.

Here, all necessary features of the present invention are not listed in the summary of the invention. The sub-combinations of the features may become the invention.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
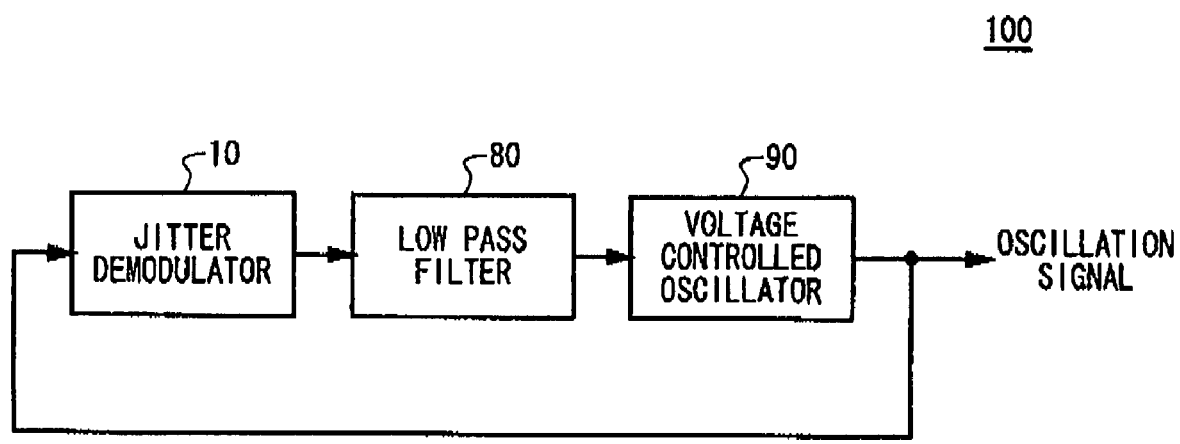
FIG. 1 shows an example of configuration of oscillator circuit 100 according to an embodiment of the present invention.

FIG. 1 shows an example of configuration of an oscillator circuit 100 according to an embodiment of the present invention. The oscillator circuit 100 is a circuit that generates an oscillation signal having a predetermined period and includes a jitter demodulator 10, a low pass filter 80 and a voltage controlled oscillator 90.

The voltage controlled oscillator 90 generates an oscillation signal having a frequency corresponding to a provided control voltage and outputs the same. The voltage controlled oscillator, for example, may be a circuit in which inverters having the delay time changed according to the control voltage are circularly connected. The control voltage may be provided to the inverters as a power supply voltage.

The jitter demodulator 10 extracts a phase fluctuation component of the oscillation signal outputted by the voltage controlled oscillator 90. For example, the jitter demodulator 10 may extract the timing jitter component, the period jitter component or the fluctuation component of the frequency. Additionally, the jitter demodulator 10 adjusts the control voltage provided to the voltage controlled oscillator 90. The jitter demodulator 10 may generate the control voltage according to the phase fluctuation component and also may adjust the control voltage generated by another circuit. In the present embodiment, DC voltage corresponding to a proper period of the oscillation signal is provided as the control signal to the voltage controlled oscillator 90. The jitter demodulator 10 modulates the control signal by superimposing a voltage corresponding to the detected phase fluctuation component on the control signal.

Thus, the phase noise component generated in the voltage controlled oscillator 90 can be reduced. Additionally, as described above, for a conventional PLL circuit the phase noise component in the oscillation signal is generated because of the phase noise component in the reference signal. Meanwhile, the oscillator circuit 100 according to the present embodiment does not use any reference signal from outside, so that the phase noise component in the oscillation signal can be prevented from being increased because of the phase noise component in the reference signal.

The low pass filter 80 passes therethrough the low-frequency components of the voltage outputted by the jitter demodulator 10. For example, the low pass filter 80 may remove frequency components larger than a cutoff frequency defined provided that the loop of the voltage controlled oscillator 90, the jitter demodulator 10 and the low pass filter does not oscillate. The cutoff frequency may be smaller than the frequency of the oscillation signal to be generated. Thus, the loop for reducing the phase noise component can be prevented from oscillating.

Figure 2:
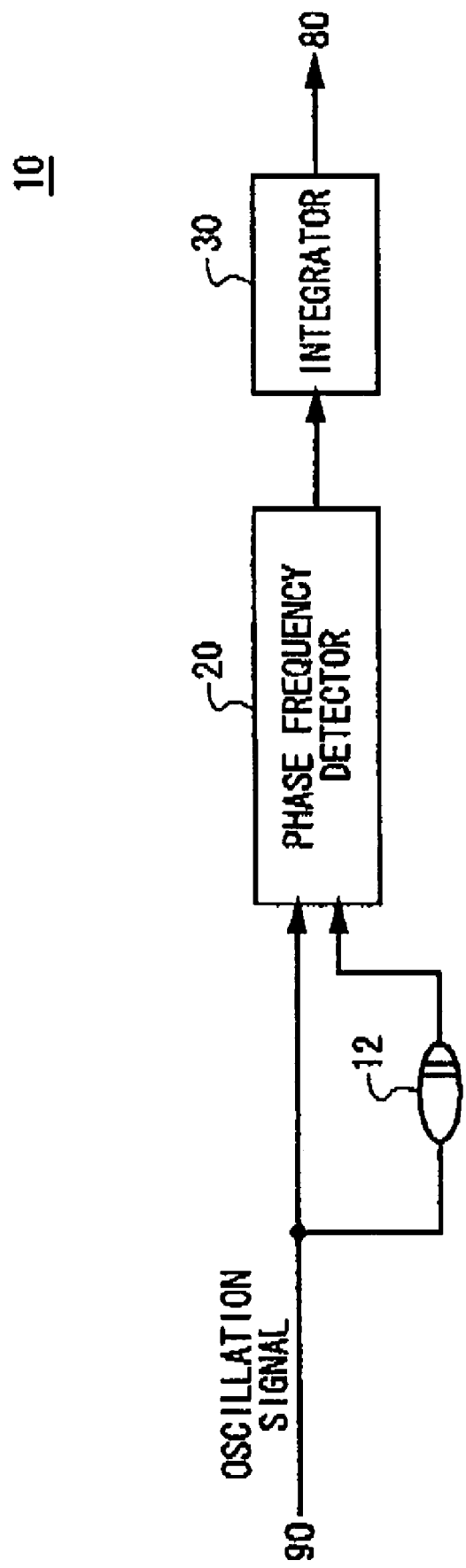
FIG. 2 shows an example of configuration of jitter demodulator 10.

FIG. 2 shows an example of configuration of the jitter demodulator 10. The jitter demodulator 10 according to the present embodiment extracts period jitter or timing jitter in an oscillation signal. Here, the timing jitter may be the phase difference between the oscillation signal and an ideal oscillation signal at a zero-crossing point of the oscillation signal. Meanwhile, the timing jitter may be the phase difference between the edge of the oscillation signal and the edge of the ideal oscillation signal.

Additionally, the period jitter may be the difference between timing jitters at a zero-cross point of the adjacent rising (or falling) edges of the oscillation signal. That is, the period jitter means difference value between the timing jitters.

The jitter demodulator 10 according to the present embodiment includes a delay circuit 12, a phase frequency detector 20 and an integrator 30. The phase frequency detector 20 extracts the period jitter of an oscillation signal based on the phase difference between the oscillation signal outputted by the voltage controlled oscillator 90 and a delay signal outputted by the delay circuit 12.

The delay circuit 12 receives a split signal of the oscillation signal inputted to the phase frequency detector 20 and outputs a delay signal that delayed by an integral multiple of the average period of the oscillation signal. The average period of the oscillation signal may be a proper period of the oscillation signal without any phase noise component. The amount of delay in the delay circuit 12 may previously set by a user corresponding the proper period of the oscillation signal. The jitter demodulator 10 may further include a period detector that detects the average period of the oscillation signal outputted by the voltage controlled oscillator 90 and sets the amount of delay in the delay circuit 12. The delay circuit 12 according to the embodiment generates a delay equivalent to one period of the oscillation signal.

Thus, the delay circuit 12 generates the delay equivalent to one period of the oscillation signal. Next, the phase frequency detector 20 detects the difference between the timing jitters at a zero-crossing point of the adjacent rising (or falling) edges of the oscillation signal. That is, the phase frequency detector 20 can extract the period jitter of an oscillation signal.

Meanwhile, the integrator 30 integrates the period jitter extracted by the phase frequency detector 20. The timing jitter of the oscillation signal can be obtained by integrating the period jitter.

The jitter demodulator 10 may control the control voltage of the voltage controlled oscillator 90 based on the period jitter of the oscillation signal. In this case, the jitter demodulator 10 may provide the output of the phase frequency detector 20 to the low pass filet 80 without the integrator 30. Additionally, the jitter demodulator 10 may control the control voltage of the voltage controlled oscillator 90 based on the timing jitter of the oscillation signal. In this case, the jitter demodulator 10 may provide the output of the integrator 30 to the low pass filter 80.

Figure 3:
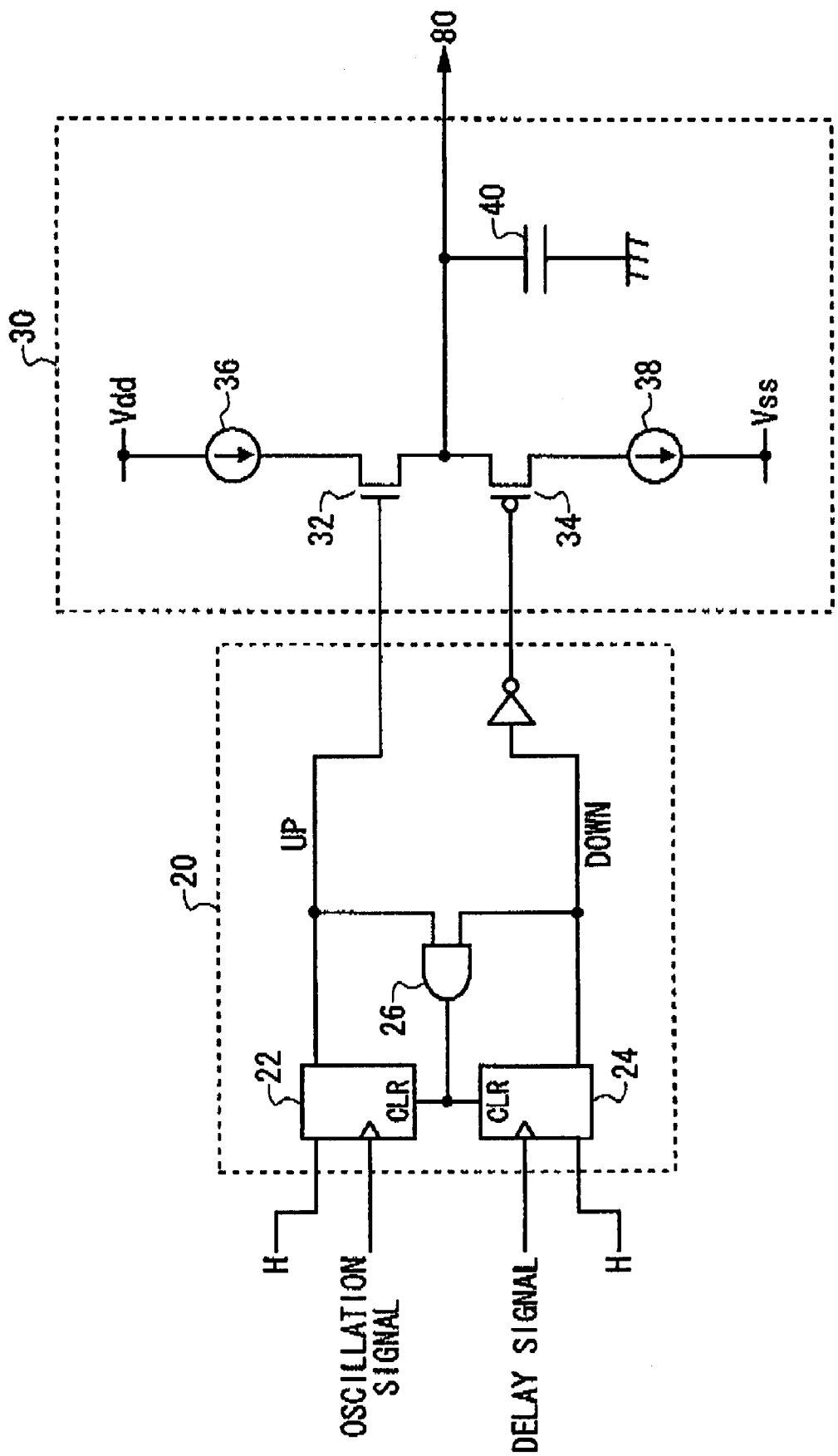
FIG. 3 shows an example of configuration of a phase frequency detector 20 and an integrator 30.

FIG. 3 shows an example of configuration of the phase frequency detector 20 and the integrator 30. The phase frequency detector 20 includes a first flip flop 22, a second flip flop 24 and an AND circuit 26. Each of the first flip flop 22 and the second flip flop 24 may be such as a D flip flop.

In the first flip flop 22, an oscillation signal is received at a clock input and a signal fixed to a logic high level is received at a data input. That is, the first flip flop 22 takes on the logic high state corresponding to the rising edge of the oscillation signal and outputs the signal in the logic high state.

In the second flip flop 24, a delay signal is received at a clock input and a signal fixed to a logic high level is received at a data input. That is, the second flip flop 24 takes on the logic high state in response to the rising edge of the delay signal and outputs the signal in the logic high state.

The AND circuit 26 provides the logical product of an output of the first flip flop 22 and an output of the second flip flop 24 to the reset terminal for each of the first flip flop 22 and the second flip flop 24. That is, when the outputs of both of the first flip flop 22 and the second flip flop 24 is at the logic high level, those of the first flip flop 22 and the second flip flop 24 are reset to a logic low state.

Thus, when the phase of the rising edge of the oscillation signal goes ahead of the phase of the rising edge of the delay signal, a pulse with a width corresponding to the phase difference between them is outputted from the first flip flop 22. Alternatively, when the phase of the rising edge of the oscillation signal is fallen behind the phase of the rising edge of the delay signal, a pulse with an width corresponding to the phase difference between them is outputted from the second flip flop 24.

When the control signal is modulated corresponding to the period jitter, the control signal may be decreased/increased according to the width of the pulse outputted by the first flip flop 22. Also the control signal may be increased/decreased according to the width of the pulse outputted by the second flip flop 24.

The integrator 30 includes a source side transistor 32, a sink side transistor 34, a source side current source 36, a sink side current source 38 and a condenser 40. Each of the source side current source 36 and the sink side current source 38 generates a predetermined current. The source side transistor 32 charges the condenser 40 with the current generated by the source side current source 36 while the first flip flop 22 outputs at the logic high level. Meanwhile, the sink side transistor 34 discharges the condenser 40 with the current outputted by the sink side current source 38 while the second flip flop 24 outputs at the logic high level. The voltage of the condenser 40 is provided to the low pass filter 80.

Thus, the period jitter detected by the phase frequency detector 20 is integrated, so that the timing jitter in the oscillation signal can be extracted.

Figure 4:
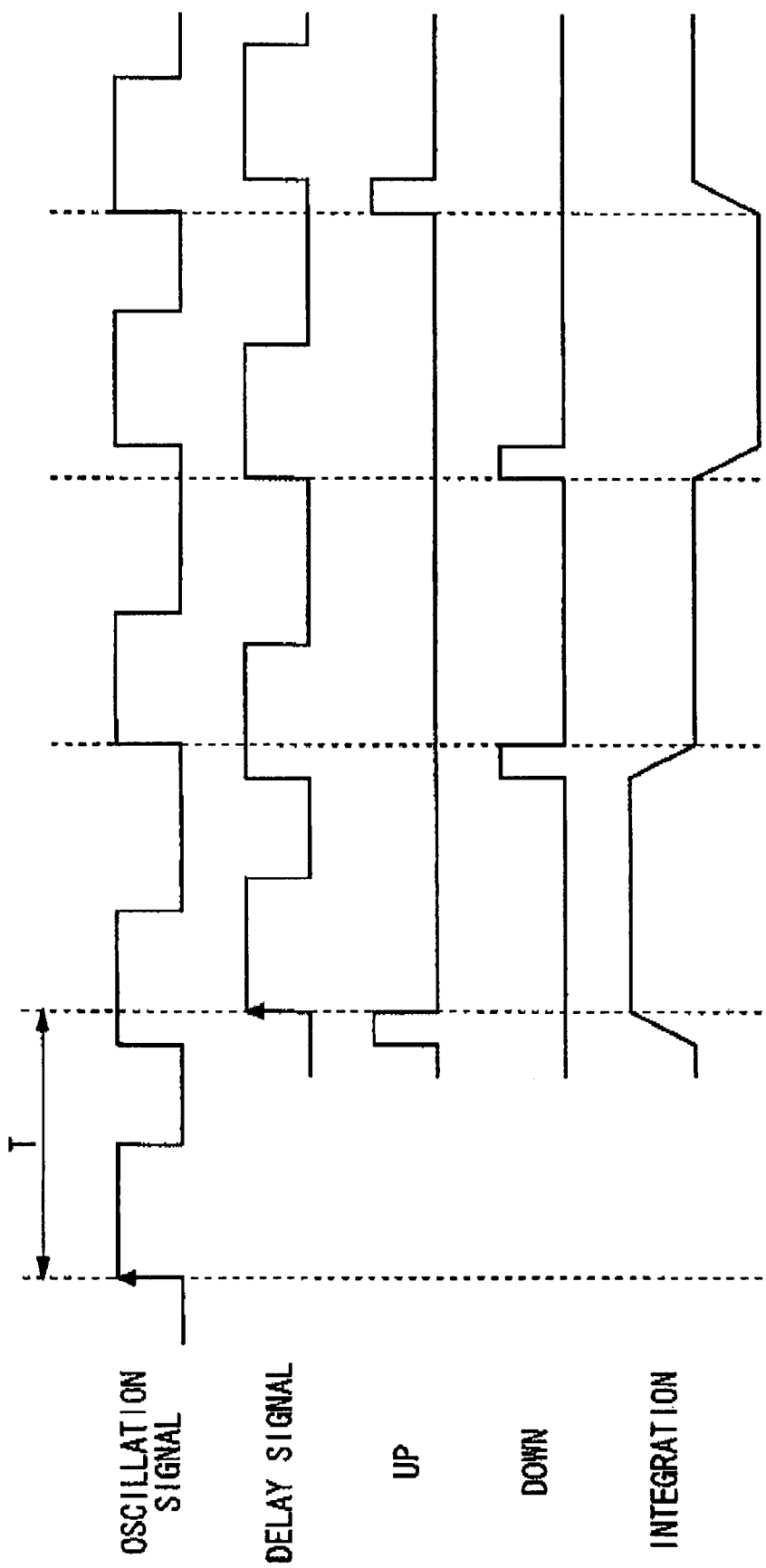
FIG. 4 shows an example of operation of the jitter demodulator 10 described in FIG. 2 and FIG. 3.

FIG. 4 shows an example of operation of the jitter demodulator 10 described in FIG. 2 and FIG. 3. The average period of the oscillation signal is T in the present embodiment. The delay circuit 12 outputs a delay signal obtained by delaying the oscillation signal by the average period T.

When the phase of the oscillation signal goes ahead of the phase of the delay signal, the first flip flop 22 outputs a signal (UP) with a pulse width corresponding to the phase difference between them. Meanwhile, when the phase of the oscillation signal is fallen behind the phase of the delay signal, a signal (DOWN) with a pulse width corresponding to the phase difference between them.

The integrator 30 integrates the signal (UP) and the signal (DOWN) and extracts the timing jitter of the oscillation signal. In this case, the magnitude of current generated by the source side current source 36 and the magnitude of current generated by the sink side current source 38 may be substantially equal to each other.

The low pass filter 80 may pass therethrough predetermined frequency components in an integrated signal outputted by the integrator 30 and superimpose the same on the control voltage.

Figure 5:
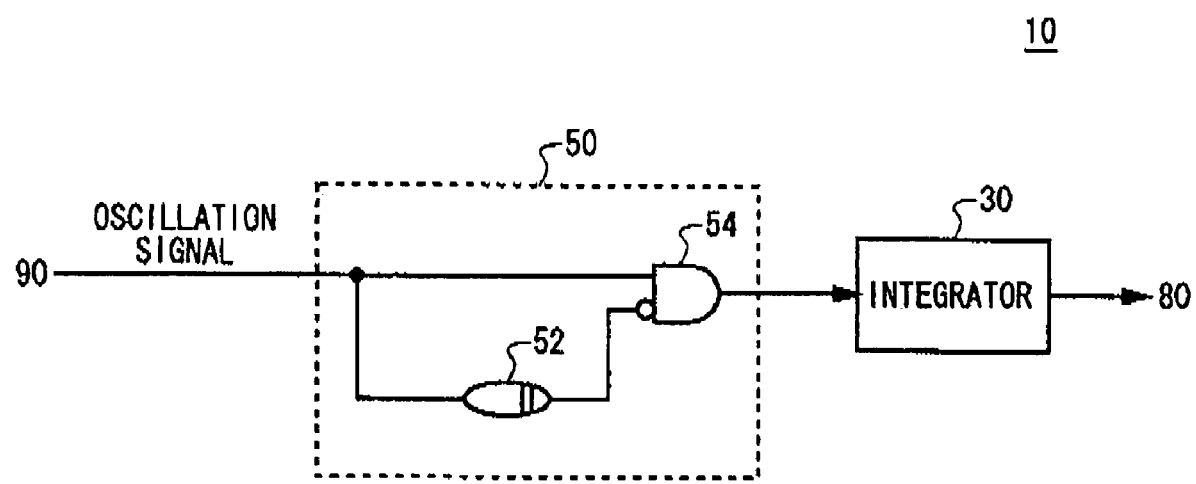
FIG. 5 shows another example of configuration of the jitter demodulator 10.

FIG. 5 shows another example of configuration of the jitter demodulator 10. The jitter demodulator 10 includes a pulse generator 50 and an integrator 30. The integrator 30 may be the same as the integrator 30 described in FIG. 3. Here, in the present embodiment, an output of the pulse generator 50 is inputted to a gate terminal of the source side transistor 32, and an inverted signal of the output of the pulse generator 50 is inputted to a gate terminal of the sink side transistor 34.

The pulse generator 50 outputs a pulse with a predetermined width W corresponding to the edge of the oscillation signal outputted by the voltage controlled oscillator 90. For example, the pulse width generator 50 may output the pulse for each rising edge or falling edge of the oscillation signal.

The pulse generator 50 includes a delay circuit 52 and an AND circuit 54. The delay circuit 52 receives a split signal of the oscillation signal, delays the same by a delay time W corresponding to the pulse width W and outputs a delayed signal. The AND circuit 54 outputs a logical product of the oscillation signal and the inverted signal of the output of the delay circuit 52. Thus, a pulse with the width W can be outputted for every rising edges of the oscillation signal. The pulse signal is corresponding to the period jitter of the oscillation signal. The jitter demodulator 10 may modulate the control voltage of the voltage controlled oscillator 90.

The integrator 30 integrates pulse signals outputted by the pulse generator 50. The timing jitter of the oscillation signal can be extracted by integrating the pulse signals. The output of the integrator 30 may be superimposed on the control voltage through the low pass filter 80.

Figure 6:
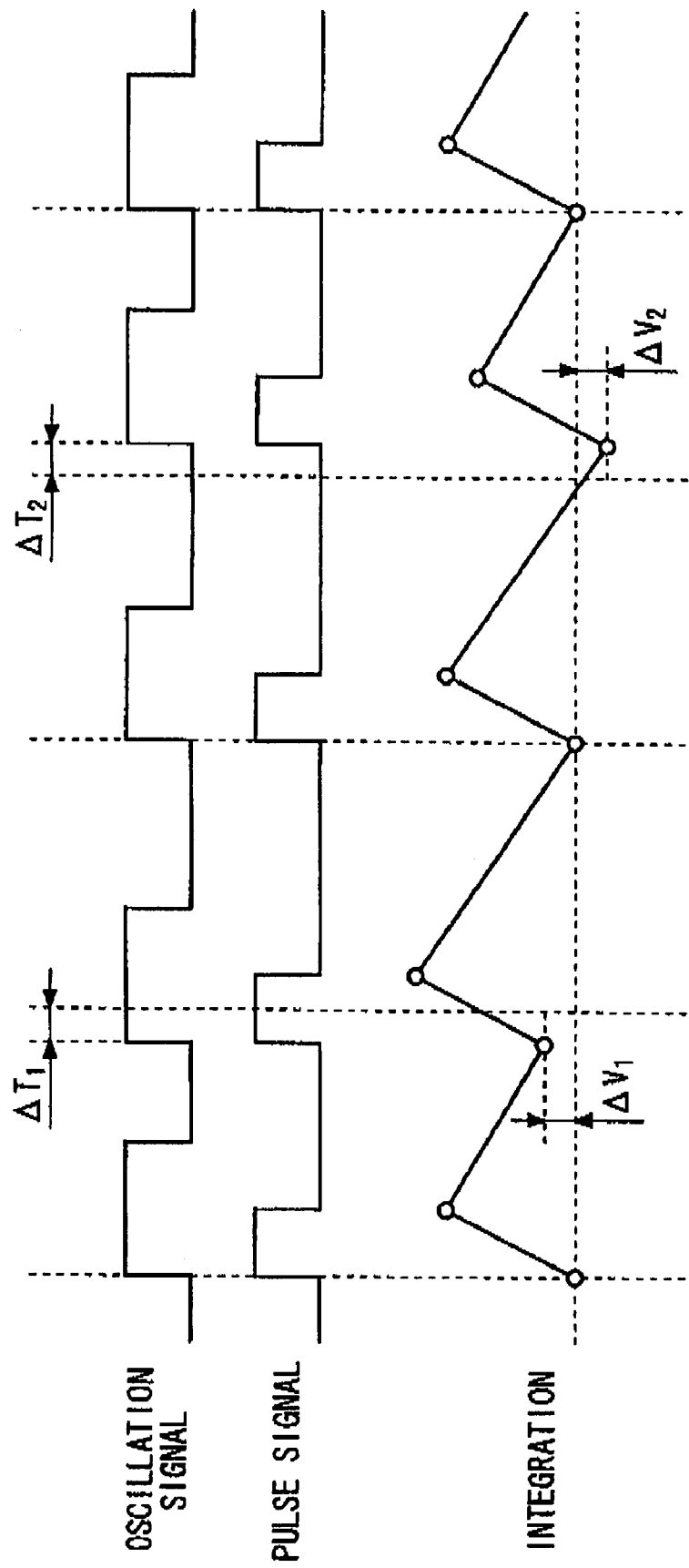
FIG. 6 shows an example of operation of the jitter demodulator 10 described in FIG. 5.

FIG. 6 shows an example of operation of the jitter demodulator 10 described in FIG. 5. The pulse generator 50 outputs a pulse signal with a predetermined width for every rising edges of the oscillation signal.

The integrator 30 charges the condenser 40 with a current generated by the source side current source 36 while the pulse signal is in a logic high state. Meanwhile, the integrator 30 discharges the condenser 40 with a curt generated by the sink side current source 38 while the pulse signal is in a logic low state. Thus, an waveform shown in FIG. 6 can be obtained.

$\Delta V1$ and $\Delta V2$ which are the differences between the extreme values of the waveform and the reference value are corresponding to timing jitter $\Delta T1$ and $\Delta T2$ of the oscillation signal. Here, it is preferred that a curt generated by the source side current source 36 and a current generated by the sink side current source 38 is previously adjusted such that the difference between the extreme value and the reference value is substantially zero when an oscillation signal without jitter is inputted.

Figure 7:
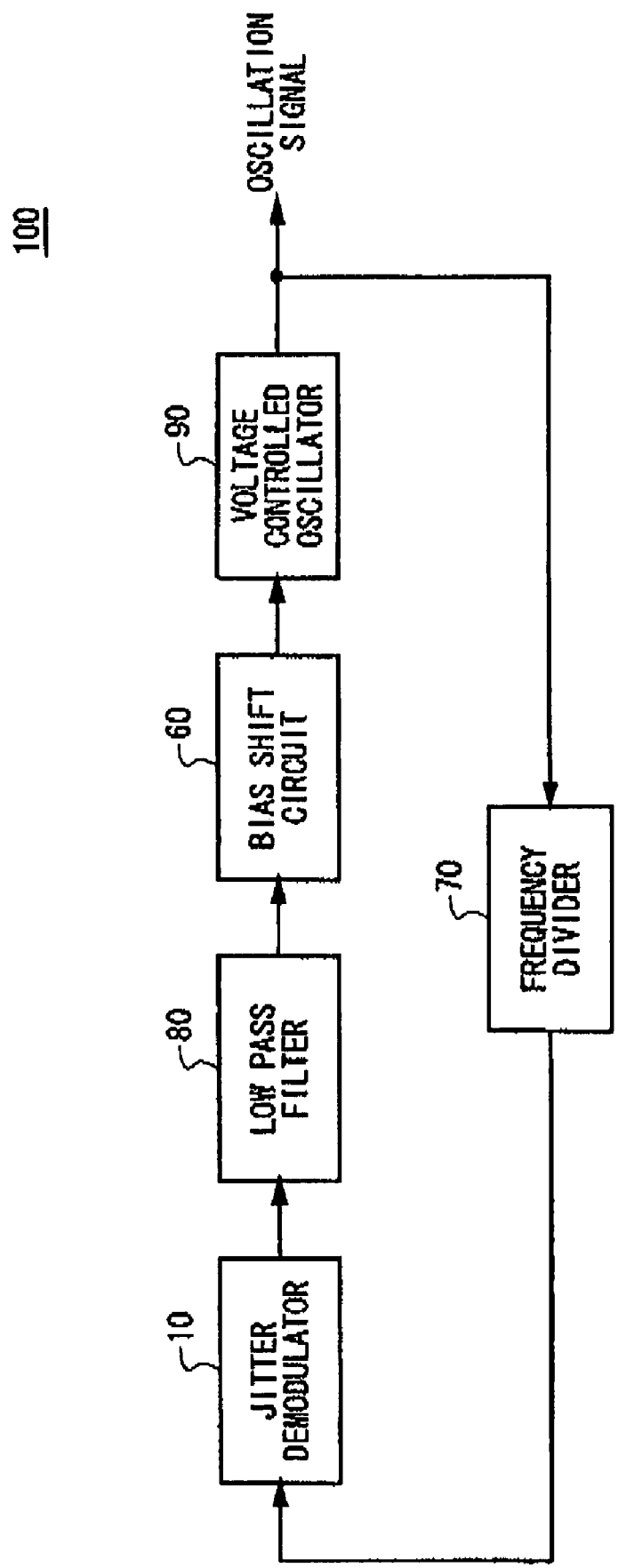
FIG. 7 shows another configuration of the oscillator circuit 100.

FIG. 7 shows another configuration of the oscillator circuit 100. The oscillator circuit 100 according to the present embodiment further includes a bias shift circuit 60 and a frequency divider 70 in addition to the components of the oscillator circuit 100 described with reference to FIG. 1. However, the oscillator circuit 100 may include either the bias shift circuit 60 and the frequency divider 70.

The bias shift circuit 60 level-shifts a control voltage inputted to the voltage controlled oscillator corresponding to a proper carrier frequency of the oscillation signal. For example, the bias shift circuit 60 generates a control signal obtained by adding or subtracting a signal outputted by the low pass filter to/from a predetermined bias voltage corresponding to the carrier frequency of the oscillation signal so as to reduce the phase noise component of the oscillation signal. The bias shift circuit 60 provides the generated control voltage to the voltage controlled oscillator 90. The average frequency of the oscillation signal can be set as the carrier frequency by the bias voltage. Additionally, the phase noise component of the oscillation signal can be reduced by the signal from the low pass filter 80.

The frequency divider 70 divides the frequency of the oscillation signal by a predetermined division ratio and inputs the same to the jitter demodulator 10. Even if the frequency of the oscillation signal is divided, the phase noise of the oscillation signal is saved, so that the phase noise component can be reduced.

Figure 8:
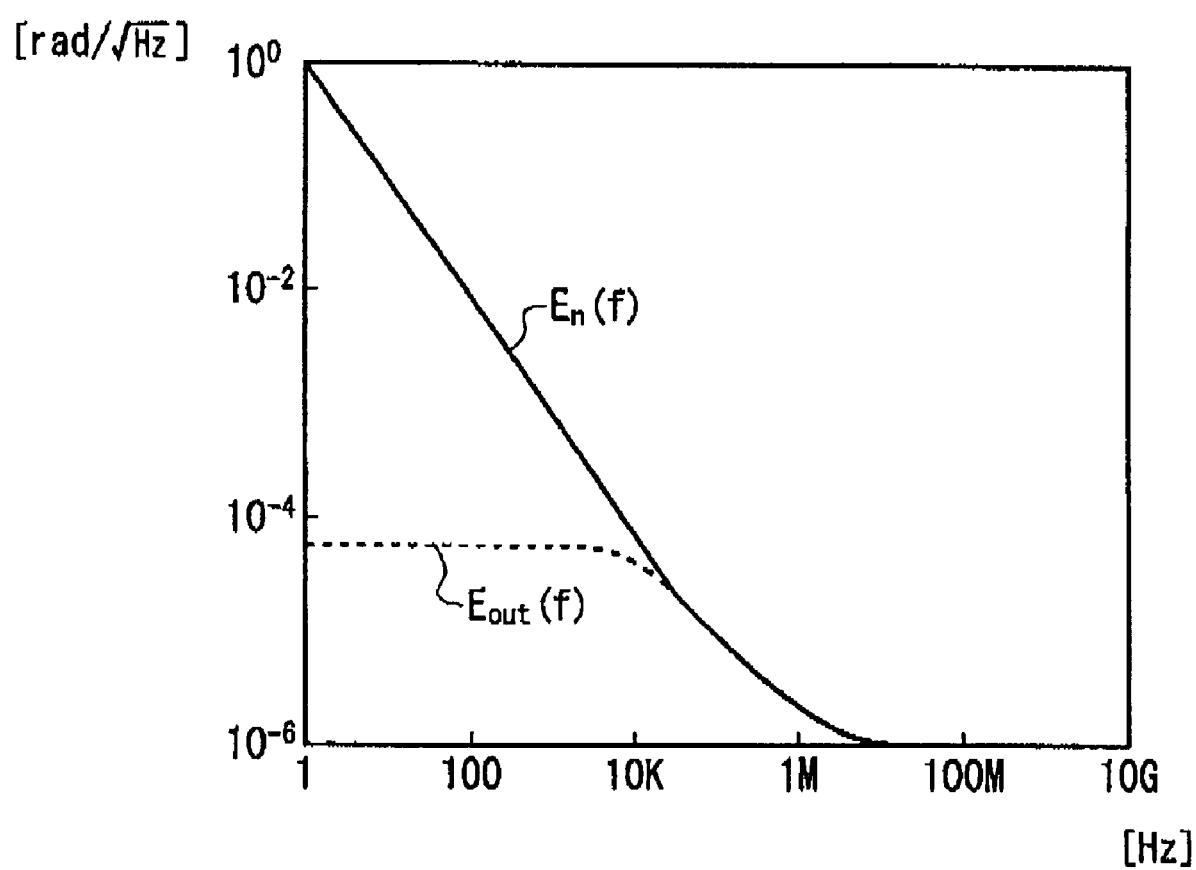
FIG. 8 shows an example of phase noise in an oscillation signal.

FIG. 8 shows an example of phase noise in an oscillation signal. The horizontal axis of FIG. 8 indicates the offset frequency of the phase noise component for the carrier frequency of the oscillation signal. Meanwhile, the vertical axis of FIG. 8 shows the magnitude of the phase noise component for each frequency. In FIG. 8, phase noise Eout(s) in an oscillation signal generated by the oscillator circuit 100 is shown by a broken line, and phase noise En (s) in an oscillation signal generated by a conventional oscillator is shown in by solid line. The present embodiment shows that the jitter demodulator 10 of the oscillator circuit 100 extracts the timing jitter of the oscillation signal.

In the oscillator circuit 100 described in FIG. 1, the transfer function (jitter gain) of the jitter demodulator 10 is $K_{TVC}$, the transfer function of the low pass filter 80 is $H_{LF}(s)$ and the transfer function of the voltage controlled oscillator 90 is $K_{VCO}/s$. Here, s is Laplace transformer. Additionally, the phase noise component generated in the oscillation signal outputted by the oscillator circuit 100 is Eout(s), and the phase noise component generated in the voltage controlled oscillator 90 is En(s).

Transfer function H(s)=Eout(s)/En(s) of the phase noise component Eout(s) of the oscillation signal for the phase noise component En(s) generated in the voltage controlled oscillator 90 is obtained by the following expression.

$$H(s) = \frac{1}{1 + \frac{K_{TVC} \cdot H_{LF}(s) \cdot K_{VCO}}{s}}$$

The transfer function of the low pass filter 80 is $H_{LF}(s)=\infty_0/(s+\infty_0)$, where the low pass filter 80 is a first order low pass filter. Then, provided that $\alpha=K_{TVC} \times K_{VCO}$, the transfer function H(s) of the oscillator circuit 100 is obtained by the following expression.

$$H(s) = \frac{1}{1 + \frac{\alpha \omega_0}{s(s+\omega_0)}} = \frac{s(s+\omega_0)}{s(s+\omega_0)+\alpha\omega_0}$$

Here, provided that $\omega_0=2\pi f_0$, gain G (f) of the transfer function H(s) is obtained by the following expression. Here, $f_0$ indicates a carrier frequency of the oscillation signal.

$$G(f) = |H(j2\pi f)| = \left| \frac{j2\pi f(j2\pi f + j2\pi f_0)}{j2\pi f(j2\pi f + j2\pi f_0) + \alpha 2\pi f_0} \right|$$

Here, assuming that the phase noise En(f) of the voltage controlled oscillator 90 is 1/f+10^-6, the phase noise Eout(f) of the oscillation signal is a spectrum indicated by the doted line shown in FIG. 8. Here, 1/f(rad/Hz^0.5) indicates noise component inversely proportional to the oscillation frequency of the voltage controlled oscillator 90, and 10^-6 (rad/Hz^5) indicates an example value of white noise component independent of the oscillation frequency of the voltage controlled oscillator 90. The low pass filter 80 may have the frequency characteristic that passes therethrough 1/f noise component.

Since an output of the jitter demodulator 10 is provided to the voltage controlled oscillator 90 trough the low pass filter 80, the phase noise in the low-frequency range can be reduced as shown in FIG. 8. Meanwhile, the oscillator circuit 100 may not have the low pass filter 80.

Figure 9:
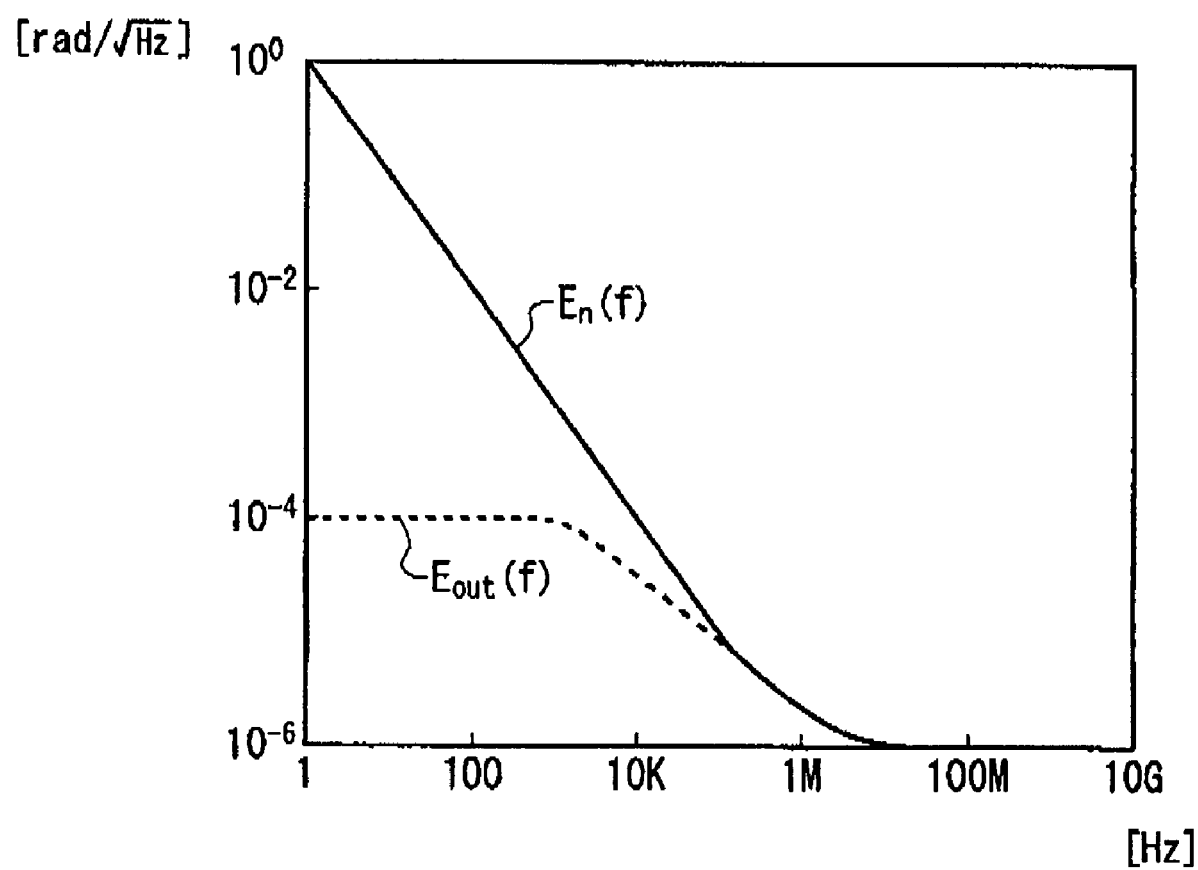
FIG. 9 shows an example of phase noise in the oscillation signal generated by the oscillator circuit 100 without a low pass filter 80.

FIG. 9 shows an example of phase noise in the oscillation signal generated by the oscillator circuit 100 without a low pass filter 80. When the oscillator circuit 100 does not have the low pass filter 80, the transfer function H(s) of the oscillator circuit 100 can be obtained by the expression described in FIG. 8, where, $H_{LF}(S)=1$. Accordingly, gain G(f) of the transfer function H(s) is obtained by the following expression.

$$G(f) = |H(j2\pi f)| = \left| \frac{j2\pi f}{j2\pi f + \alpha} \right| = \frac{f}{\sqrt{f^2 + \left(\frac{\alpha}{2\pi}\right)^2}}$$

Provided that the phase noise En (f) of the voltage controlled oscillator 90 is 1/f+10^-6 as described above, the phase noise Eout(f) of the oscillation signal is a spectrum indicated by the dotted line in FIG. 9.

Since the oscillator circuit 100 does not have the low pass filter 80, the jitter components of higher frequency can be reduced due to the feedback of the jitter demodulator 10. Therefore, the phase noise around 10 kHz is more reduced as shown in FIG. 9. That is, it is preferred that the oscillator circuit 100 does not have the low pass filter 80 in view of reducing the phase noise. In this case, it is preferred that the voltage controlled oscillator 90 and the jitter demodulator 10 are designed such that the loop including the voltage controlled oscillator 90 and the jitter demodulator 10 is not oscillated as described above.

Also the spectrum of the phase noise in the oscillation signal when the jitter demodulator 10 extracts period jitter can be obtained in the same way.

Figure 10:
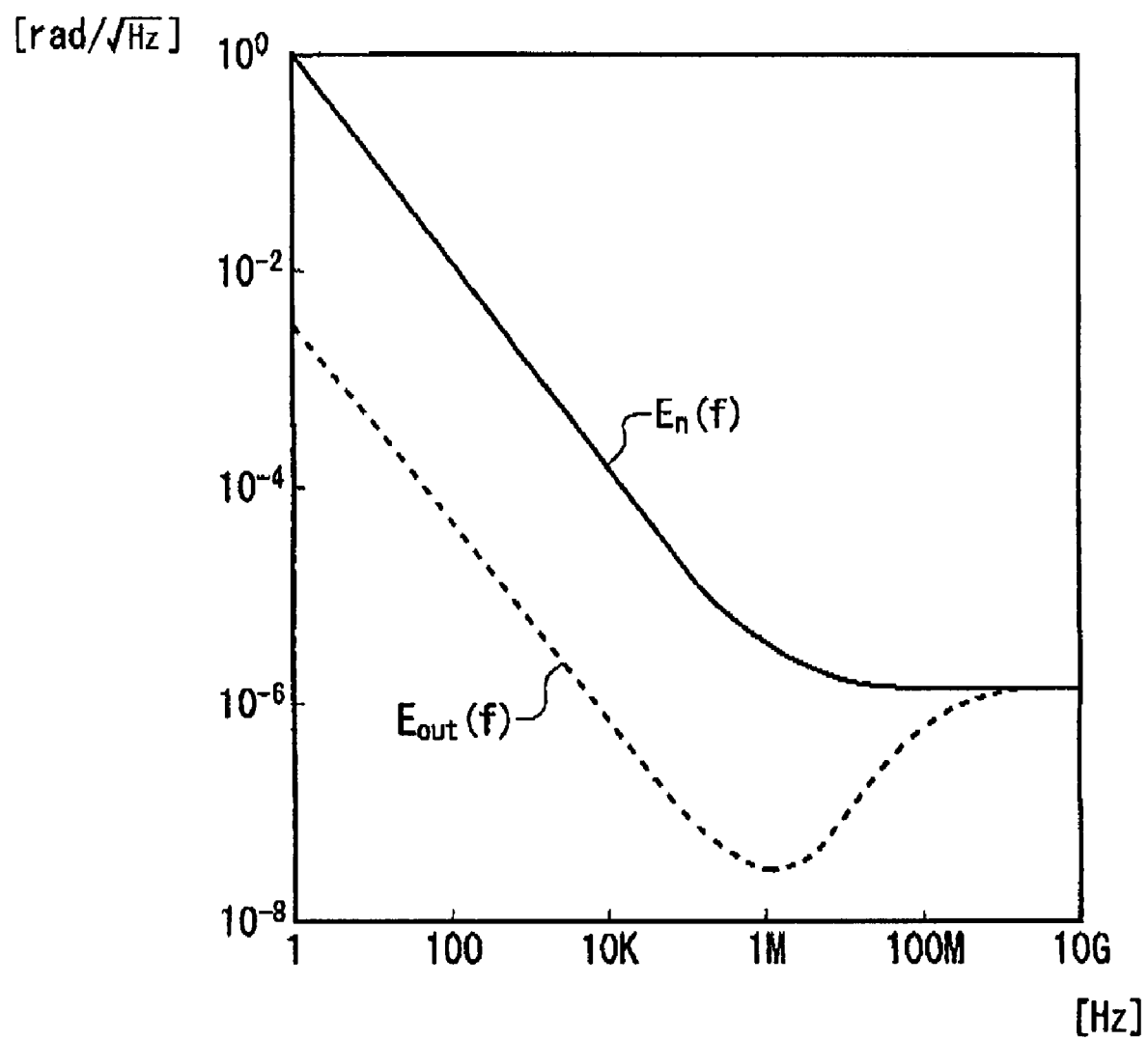
FIG. 10 shows an example of phase noise in the oscillation signal when the jitter demodulator 10 extracts period jitter.

FIG. 10 shows an example of phase noise in the oscillation signal when the jitter demodulator 10 extracts period jitter. Since the period jitter is in proportion to the difference of the timing jitter, the transfer function of the jitter demodulator 10 is indicated by $sK_{JVC}$. The transfer function of the other circuit is the same as the transfer function described in FIG. 8.

The transfer function H(s) of the oscillator circuit 100 is obtained by the following expression.

$$H(s) = \frac{1}{1 + K_{JVC} \cdot H_{LF}(s) \cdot K_{VCO}}$$

The transfer function of the low pass filter 80 is $H_{LF}(s)=\infty_0/(s+\infty_0)$, where the low pass filter 80 is a first order low pass filter. Then, provided that $\alpha=K_{TVC} \times K_{VCO}$, the transfer function H(s) of the oscillator circuit 100 is obtained by the following expression.

$$H(s) = \frac{s+\omega_0}{s+(1+\alpha)\omega_0}$$

Here, provided that $\omega_0=2\pi f_0$, gain G (f) of the transfer function H(s) is obtained by the following expression. Here, $f_0$ indicates a carrier frequency of the oscillation signal.

$$G(f) = |H(j2\pi f)| = \left|\frac{j2\pi f + 2\pi f_0}{j2\pi f + 2\pi f_0(1 + \alpha)}\right|$$

Here, assuming that the phase noise En(f) of the voltage controlled oscillator 90 is $1/f+10^{\wedge}-6$, the phase noise Eout(f) of the oscillation signal is a spectrum indicated by the doted line shown in FIG. 10. Also when the jitter demodulator 10 demodulates the period jitter as shown in FIG. 10, the phase noise of the oscillation signal in the low-frequency range can be reduced.

Figure 11:
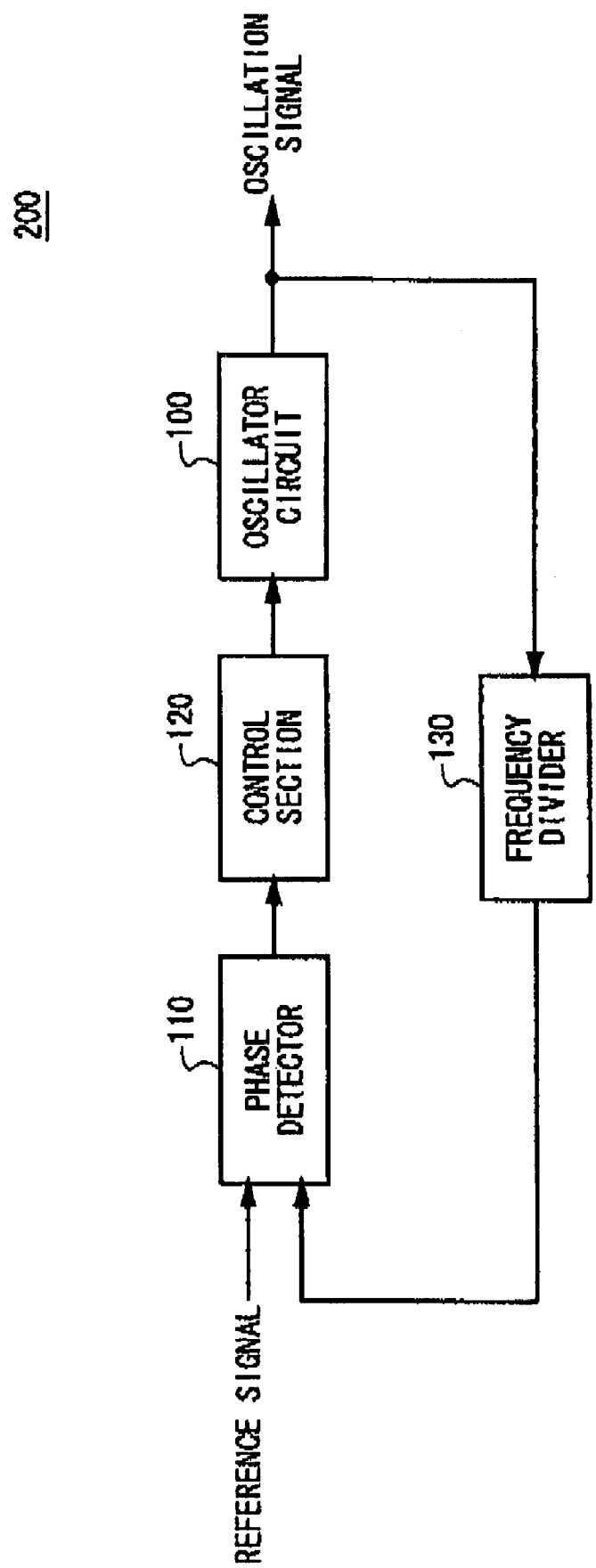
FIG. 11 shows an example of configuration of a PLL circuit 200 according to an embodiment of the present invention.

FIG. 11 shows an example of configuration of a PLL circuit 200 according to an embodiment of the present invention. The PLL circuit 200 is a circuit that generates an oscillation signal and includes an oscillator circuit 100, a phase detector 110, a control section 120 and a frequency divider 130.

The oscillator circuit 100 is the same as the oscillator circuit 100 described in FIG. 1-FIG. 10 and also generates an oscillation signal. The frequency divider 130 receives a split signal of the oscillation signal outputted by the oscillator circuit 100 and divides frequency of the same by a predetermined division ratio.

The phase detector 110 receives the oscillation signal outputted by the oscillator circuit 100 through the frequency divider 130 and detects the phase difference between the oscillation signal and a provided reference signal. It is preferred that the reference signal is a low-noise signal, which is generated by such as a crystal oscillator.

The control section 120 provides the control voltage corresponding to the phase difference detected by the phase detector 110. The control voltage is provided to the voltage controlled oscillator 90 of the oscillator circuit 100. The jitter demodulator 10 of the oscillator circuit 100 may adjust the control voltage based on the extracted phase noise component.

Thus, the PLL circuit 200 in which the phase noise is more reduced can be provided. The PLL circuit 200 according to the present embodiment can also reduce the phase noise of an oscillation signal in the interval in which the oscillator circuit 100 self-oscillates.

Figure 12:
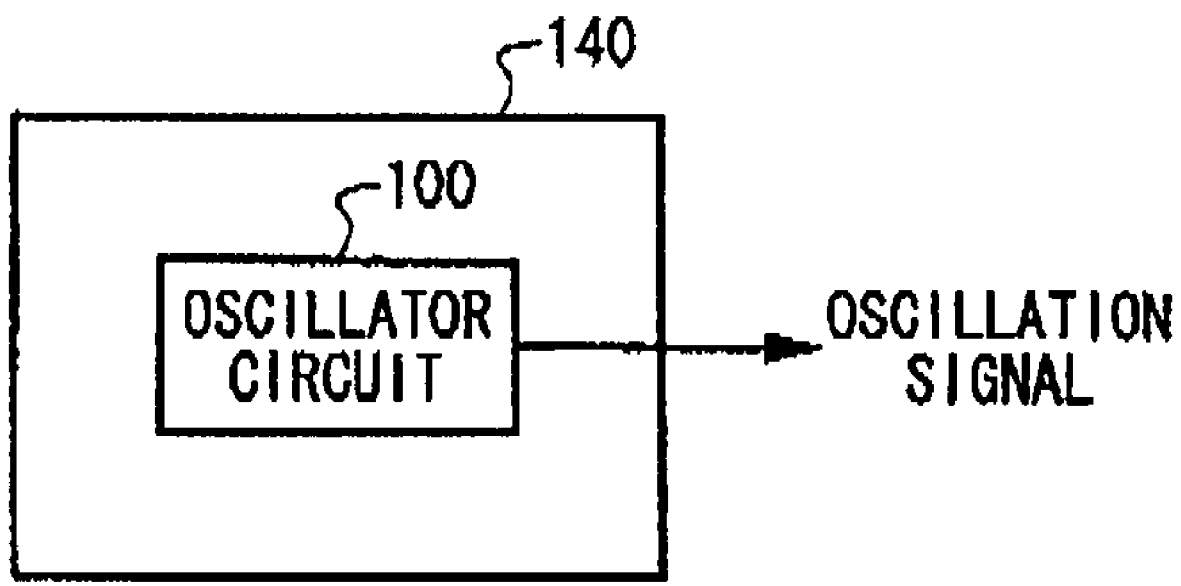
FIG. 12 shows an example of configuration of a semiconductor chip 300 according to an example of the present invention.

FIG. 12 shows an example of configuration of a semiconductor chip 300 according to an embodiment of the present invention. The semiconductor chip 300 is a chip that generates an oscillation signal and includes an oscillator circuit 100 and a circuit board 140. The circuit board 14 may be a semiconductor substrate. Additionally, the oscillator circuit 100 has a configuration the same as that of the oscillator circuit 100 described in FIG. 1-FIG. 10, and which may be a semiconductor circuit formed on the circuit board 140. The circuit board 140 may be sealed in a package such as ceramic and resin.

The oscillator circuit 100 may output an oscillation signal to the outside of the semiconductor chip 300. Additionally, the oscillator circuit 100 may provide the oscillation signal to another circuit provided within the semiconductor chip 300. Thus, the semiconductor chip 300 that generates a high-accurate oscillation signal can be provided. Additionally, when the oscillation signal is used in the other circuit within the semiconductor chip 300, the semiconductor chip 300 that high-accurately operates can be provided.

Figure 13:
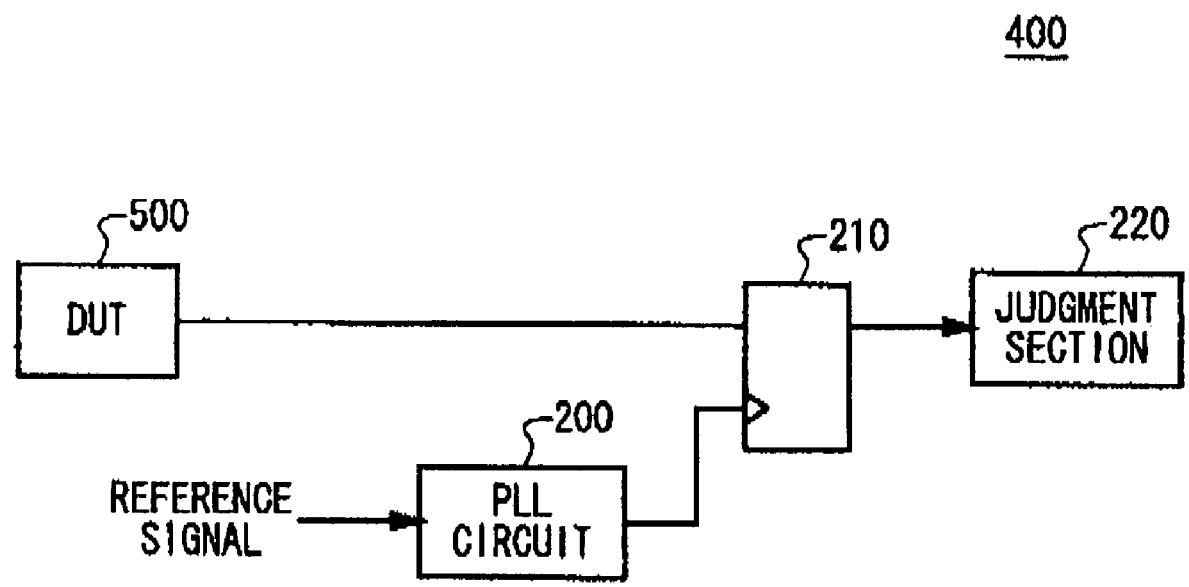
FIG. 13 shows an example of configuration of a test apparatus 400 according to an embodiment of the present invention.

FIG. 13 shows an example of configuration of a test apparatus 400 according to an embodiment of the present invention. The test apparatus 400 tests a device under test 500 such as a semiconductor chip and includes an oscillator circuit 100, a sampling section 210, and a judging section 220. The test apparatus 400 according to the present embodiment includes a PLL circuit having the oscillator circuit 100.

The PLL circuit 200 generates an oscillation signal. The PLL circuit 200 according to the present embodiment may receive a signal having relatively small amount of jitter as a reference signal and may generate a clock signal with low jitter as the oscillation signal.

The sampling section 210 samples an output signal of the device under test 500 corresponding to the oscillation signal provided from the PLL circuit 200. For example, the sampling section 210 samples the level and the logical value of the device under test 500 corresponding to the oscillation signal. For example, the sampling section 210 may be an AD converter, a flip flop and an AND circuit.

The judgment section 220 judges pass/fail of the device under test 500 based on the result of sampling by the sampling section 210. For example, the judgment section 220 may judge pass/fail of the device under test 500 based on whether the logic pattern of the output signal detected by the sampling section 210 is equal to the expected value pattern thereof. Additionally, the judgment section 220 may calculate a jitter value of the output signal based on the result of sampling by the sampling section 210.

Thus, the clock with low jitter can be employed. Therefore, the output signal of the device under test 500 is high-accurately sampled by using the clock with low jitter as a timing reference, so that the test apparatus 400 being capable of accurately testing the device under test 500 can be provided. The test apparatus 400 may further include a signal provision section that provides a test signal to the device under test 500. The signal provision section may provide the test signal with a predetermined logic pattern to the device under test 500.

The PLL circuit 200 may generate a recovery clock synchronized with the output signal of the device under test 500. That is, the PLL circuit 200 may receive the output signal of the device under test 500 as the reference signal. Thus, the original bit value of the output signal of the device under test 500 can be correctly recovered, therefore, the device under test 400 being capable of accurately testing the device under test 500 can be provided.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

What is claimed is:

1. An oscillator circuit configured to generate an oscillation signal, comprising:
    a voltage control oscillator configured to output the oscillation signal having a frequency corresponding to a provided control voltage;
    a jitter demodulator configured to extract a phase fluctuation component of the oscillation signal outputted by the voltage control oscillator and modulate the control voltage dependent on the phase fluctuation component; and
    a low pass filter configured to remove a frequency component larger than a predetermined cutoff frequency of the control frequency inputted to the voltage control oscillator and provide an output signal of the low pass filter to the voltage control oscillator.

2. The oscillator circuit as set forth in claim 1, further comprising a bias shift circuit configured and arranged to level shift the control voltage inputted to the voltage control oscillator dependent on a proper carrier frequency of the oscillation signal outputted by the voltage control oscillator.

3. The oscillator circuit as set forth in claim 1, further comprising a frequency divider configured and arranged to divide the frequency of the oscillation signal outputted by the voltage control oscillator by a predetermined division ratio to form a frequency divided signal and input the frequency divided signal to the jitter demodulator.

4. The oscillator circuit as set forth in claim 1, wherein the jitter demodulator is configured and arranged to extract periodic jitter of the oscillation signal as the phase fluctuation component.

5. The oscillator circuit as set forth in claim 4, wherein the jitter demodulator includes:
  a delay device configured and arranged to delay the oscillation signal outputted by the voltage control oscillator by an integer multiple of an average frequency of the oscillation signal; and
  a phase frequency detector configured and arranged to extract the periodic jitter of the oscillation signal based on a phase difference between the oscillation signal outputted by the voltage control oscillator and a delay signal outputted by the delay device.

6. The oscillator circuit as set forth in claim 4, wherein the jitter demodulator includes a pulse generator configured and arranged to output a pulse with a predetermined width corresponding to an edge of the oscillation signal outputted by the voltage control oscillator and extract the periodic jitter of the oscillation signal.

7. The oscillator circuit as set forth in claim 1, wherein the jitter demodulator is configured and arranged to extract timing jitter of the oscillation signal as the phase fluctuation component.

8. The oscillator circuit as set forth in claim 7, wherein the jitter demodulator includes:
  a delay device configured and arranged to delay the oscillation signal outputted by the voltage control oscillator by an integer multiple of an average frequency of the oscillation signal;
  a phase frequency detector configured and arranged to extract periodic jitter of the oscillation signal based on a phase difference between the oscillation signal outputted by the voltage control oscillator and a delay signal outputted by the delay device; and
  an integrator configured and arranged to integrate the periodic jitter extracted by the phase frequency detector and extract the timing jitter of the oscillation signal.

9. The oscillator circuit as set forth in claim 7, wherein the jitter demodulator includes:
  a pulse generator configured and arranged to output a pulse with a predetermined width corresponding to an edge of the oscillation signal outputted by the voltage control oscillator and extract periodic jitter of the oscillation signal; and
  an integrator configured and arranged to integrate the periodic jitter extracted by the pulse generator and extract the timing jitter of the oscillation signal.

10. A PLL circuit configured to generate an oscillation signal, comprising:
  an oscillator circuit configured to generate an oscillation signal;
  a phase detector configured and arranged to detect a phase difference between the oscillation signal outputted by the oscillator circuit and a provided reference signal; and
  a control section configured and arranged to provide a control voltage corresponding to the phase difference detected by the phase detector to the oscillator circuit, the oscillator circuit including:
  a voltage control oscillator configured and arranged to output the oscillation signal having a frequency corresponding to the control voltage provided from the control section; and
  a jitter demodulator configured and arranged to extract a phase fluctuation component of the oscillation signal outputted by the voltage control oscillator and modulate the control voltage dependent on the phase fluctuation component, wherein the phase fluctuation component comprises periodic jitter and the jitter demodulator includes:
    a delay device configured and arranged to delay the oscillation signal outputted by the voltage control oscillator by an integer multiple of an average frequency of the oscillation signal; and
    a phase frequency detector configured and arranged to extract the periodic jitter of the oscillation signal based on a phase difference between the oscillation signal outputted by the voltage control oscillator and a delay signal outputted by the delay device.

11. A semiconductor chip configured and arranged to generate an oscillation signal comprising a circuit board and an oscillator circuit, provided on the circuit board, configured to generate the oscillation signal, the oscillator circuit including:
  a voltage control oscillator configured and arranged to output the oscillation signal having a frequency corresponding to a provided control voltage; and
  a jitter demodulator configured and arranged to extract a phase fluctuation component of the oscillation signal outputted by the voltage control oscillator and modulate the control voltage dependent on the phase fluctuation component, the phase fluctuation component comprising periodic jitter, the jitter demodulator including:
    a delay device configured and arranged to delay the oscillation signal outputted by the voltage control oscillator by an integer multiple of an average frequency of the oscillation signal; and
    a phase frequency detector configured and arranged to extract periodic jitter of the oscillation signal based on a phase difference between the oscillation signal outputted by the voltage control oscillator and a delay signal outputted by the delay device.

12. A test apparatus that tests a device under test, comprising:
  an oscillator circuit that generates an oscillation signal;
  a sampling section configured and arranged to sample a signal outputted by the device under test corresponding to the oscillation signal; and
  a judgment section configured and arranged to judge pass/fail of the device under test based on the result of the sampling by the sampling section,
  the oscillator circuit including:
    a voltage control oscillator configured and arranged to output the oscillation signal having a frequency corresponding to a provided control voltage; and
    a jitter demodulator configured and arranged to extract a phase fluctuation component of the oscillation signal outputted by the voltage control oscillator and modulates the control voltage dependent on the phase fluctuation component, the phase fluctuation component comprising periodic jitter and the jitter demodulator including:
      a delay device configured and arranged to delay the oscillation signal outputted by the voltage control oscillator by an integer multiple of an average frequency of the oscillation signal; and a phase frequency detector configured and arranged to extract the periodic jitter of the oscillation signal based on a phase difference between the oscillation signal outputted by the voltage control oscillator and a delay signal outputted by the delay device.

13. An oscillator circuit configured to generate an oscillation signal, comprising:

a voltage control oscillator configured and arranged to output the oscillation signal having a frequency corresponding to a provided control voltage;

a jitter demodulator configured and arranged to extract a phase fluctuation component of the oscillation signal outputted by the voltage control oscillator and modulate the control voltage dependent on the phase fluctuation component; and a bias shift circuit configured and arranged to level-shift the control voltage inputted to the voltage control oscillator dependent on a proper carrier frequency of the oscillation signal outputted by the voltage control oscillator.

14. The oscillator circuit as set forth in claim 13, further comprising a frequency divider configured and arranged to divide the frequency of the oscillation signal outputted by the voltage control oscillator by a predetermined division ratio to form a frequency divided signal and provide the frequency divided signal to the jitter demodulator.

15. The oscillator circuit as set forth in claim 13, wherein the jitter demodulator is configured and arranged to extract periodic jitter of the oscillation signal as the phase fluctuation component.

16. The oscillator circuit as set forth in claim 15, wherein the jitter demodulator includes:

a delay device configured and arranged to delay the oscillation signal outputted by the voltage control oscillator by an integer multiple of an average frequency of the oscillation signal; and a phase frequency detector configured and arranged to extract the periodic jitter of the oscillation signal based on a phase difference between the oscillation signal outputted by the voltage control oscillator and a delay signal outputted by the delay device.

17. The oscillator circuit as set forth in claim 15, wherein the jitter demodulator includes a pulse generator configured and arranged to output a pulse with a predetermined width corresponding to an edge of the oscillation signal outputted by the voltage control oscillator and extract the periodic jitter of the oscillation signal.

18. The oscillator circuit as set forth in claim 13, wherein the jitter demodulator is configured and arranged to extract timing jitter of the oscillation signal as the phase fluctuation component.

19. The oscillator circuit as set forth in claim 18, wherein the jitter demodulator includes:

a delay device configured and arranged to delay the oscillation signal outputted by the voltage control oscillator by an integer multiple of an average frequency of the oscillation signal;

a phase frequency detector configured and arranged to extract periodic jitter of the oscillation signal based on a phase difference between the oscillation signal outputted by the voltage control oscillator and a delay signal outputted by the delay device; and an integrator configured and arranged to integrate the periodic jitter extracted by the phase frequency detector and extract the timing jitter of the oscillation signal.

20. The oscillator circuit as set forth in claim 18, wherein the jitter demodulator includes:

a pulse generator configured and arranged to output a pulse with a predetermined width corresponding to an edge of the oscillation signal outputted by the voltage control oscillator and extract periodic jitter of the oscillation signal; and an integrator configured and arranged to integrate the periodic jitter extracted by the pulse generator and extract the timing jitter of the oscillation signal.

21. An oscillator circuit configured and arranged to generate an oscillation signal, comprising:

a voltage control oscillator that outputs the oscillation signal having a frequency corresponding to a provided control voltage; and a jitter demodulator configured and arranged to extract a phase fluctuation component of the oscillation signal outputted by the voltage control oscillator and modulate the control voltage dependent on the phase fluctuation component, the phase fluctuation component comprising periodic jitter and the jitter demodulator including:

a delay device configured and arranged to delay the oscillation signal outputted by the voltage control oscillator by an integer multiple of an average frequency of the oscillation signal; and a phase frequency detector configured and arranged to extract the periodic jitter of the oscillation signal based on a phase difference between the oscillation signal outputted by the voltage control oscillator and a delay signal outputted by the delay device.

22. The oscillator circuit as set forth in claim 21, further comprising a frequency divider configured and arranged to divide the frequency of the oscillation signal outputted by the voltage control oscillator by a predetermined division ratio to form a frequency divided signal and provide the frequency divided signal to the jitter demodulator.

23. The oscillator circuit as set forth in claim 21, wherein the jitter demodulator includes a pulse generator configured and arranged to output a pulse with a predetermined width corresponding to an edge of the oscillation signal outputted by the voltage control oscillator and extract the periodic jitter of the oscillation signal.

* * * * *